(12) United States Patent
Akhi et al.

(10) Patent No.: US 8,738,066 B2
(45) Date of Patent: May 27, 2014

(54) WIRELESS TRANSCEIVER WITH AMPLIFIER BIAS ADJUSTED BASED ON MODULATION SCHEME AND TRANSMIT POWER FEEDBACK

(75) Inventors: Fraldun Akhi, Fremont, CA (US); Vusthla Sunil Reddy, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 351 days.

(21) Appl. No.: 12/900,406

(22) Filed: Oct. 7, 2010

(65) Prior Publication Data

US 2012/0088510 A1 Apr. 12, 2012

(51) Int. Cl.
*H04B 7/00* (2006.01)

(52) U.S. Cl.
USPC .......... 455/522; 455/69; 455/423; 455/67.11; 455/127.1

(58) Field of Classification Search
USPC ............... 455/69, 522, 13.4, 513, 504, 67.13, 455/67.11, 63.1, 115.1, 136, 138, 220, 213, 455/222, 245.1, 341, 574, 127.2, 127.4, 73, 455/450, 127.5, 119, 126, 108, 572; 330/136, 129, 302, 127, 297, 83, 98, 330/200
See application file for complete search history.

(56) References Cited

U.S. PATENT DOCUMENTS

| | | | |
|---|---|---|---|
| 5,982,824 A * | 11/1999 | Ann | 375/345 |
| 6,008,698 A | 12/1999 | Dacus et al. | |
| 6,025,753 A | 2/2000 | Landherr et al. | |
| 6,178,313 B1 | 1/2001 | Mages et al. | |
| 6,323,729 B1 | 11/2001 | Sevenhans et al. | |
| 6,351,189 B1 | 2/2002 | Hirvilampi | |
| 6,696,866 B2 | 2/2004 | Mitzlaff | |
| 6,735,422 B1 | 5/2004 | Baldwin et al. | |
| 6,765,443 B2 * | 7/2004 | Pehike | 330/296 |
| 6,819,910 B2 | 11/2004 | Shi et al. | |

(Continued)

FOREIGN PATENT DOCUMENTS

| | | |
|---|---|---|
| CN | 1268013 | 9/2000 |
| EP | 1 237 297 | 9/2002 |

(Continued)

OTHER PUBLICATIONS

"R&S CMU200 Universal Radio Communication Tester", Rohde & Schwarz, Nov. 2007.

(Continued)

*Primary Examiner* — Tan Trinh
(74) *Attorney, Agent, or Firm* — Treyz Law Group; G. Victor Treyz; Chih-Yun Wu

(57) ABSTRACT

An electronic device may contain a transceiver that transmits and receives radio-frequency signals through antenna structures. Power amplifier circuitry may amplify the radio-frequency signals that are being transmitted. An adjustable voltage supply may supply an adjustable power amplifier bias voltage to the power amplifier circuitry. The power amplifier circuitry may include multiple power amplifiers each of which may handle signals transmitted using a different cellular telephone standard. For each cellular telephone standard, multiple modulation schemes may be supported. A power detector may provide real time measurements of output power. Control circuitry can adjust the transceiver circuitry based on the measurements of output power and can adjust the adjustable power amplifier bias voltage in real time to select an optimum power amplifier bias voltage based on the current cellular telephone standard, modulation scheme, power amplifier gain state, and operating frequency in use.

17 Claims, 6 Drawing Sheets

(56) References Cited

U.S. PATENT DOCUMENTS

| | | |
|---|---|---|
| 6,819,938 B2 | 11/2004 | Sahota |
| 7,046,973 B2 | 5/2006 | Ketonen et al. |
| 7,053,708 B2 | 5/2006 | Nagamori et al. |
| 7,078,974 B2 | 7/2006 | Matsushita et al. |
| 7,110,469 B2 | 9/2006 | Shi et al. |
| 7,123,094 B2 | 10/2006 | Tahara et al. |
| 7,164,321 B2 | 1/2007 | Behzad |
| 7,412,215 B1 | 8/2008 | Hietala et al. |
| 7,539,462 B2 | 5/2009 | Peckham et al. |
| 7,583,941 B2 | 9/2009 | Nariman |
| 7,672,648 B1 * | 3/2010 | Groe et al. ................. 455/127.2 |
| 7,782,134 B2 * | 8/2010 | Drogi et al. ................... 330/136 |
| 7,787,834 B2 | 8/2010 | Rofougaran |
| 7,821,335 B2 | 10/2010 | Shiramizu et al. |
| 8,018,277 B2 * | 9/2011 | Drogi et al. ................... 330/136 |
| 8,032,097 B2 * | 10/2011 | Drogi et al. ................ 455/127.5 |
| 8,315,336 B2 * | 11/2012 | Sorrells et al. ................ 375/297 |
| 8,437,793 B2 * | 5/2013 | Donovan et al. .............. 455/522 |
| 2003/0155972 A1 | 8/2003 | Ngo et al. |
| 2003/0155978 A1 * | 8/2003 | Pehlke .......................... 330/296 |
| 2003/0201834 A1 * | 10/2003 | Pehlke .......................... 330/296 |
| 2004/0229579 A1 * | 11/2004 | Tsutsui et al. ............. 455/127.2 |
| 2005/0186923 A1 | 8/2005 | Chan |
| 2006/0046668 A1 | 3/2006 | Uratani |
| 2006/0068830 A1 * | 3/2006 | Klomsdorf et al. ........... 455/522 |
| 2006/0078067 A1 * | 4/2006 | Brobston ...................... 375/308 |
| 2006/0192616 A1 | 8/2006 | Takahashi et al. |
| 2006/0252392 A1 | 11/2006 | Beamish et al. |
| 2007/0210771 A1 | 9/2007 | Wilson et al. |
| 2008/0002786 A1 | 1/2008 | Kerth et al. |
| 2008/0171523 A1 | 7/2008 | Anderson et al. |
| 2008/0285681 A1 * | 11/2008 | Sorrells et al. ................ 375/297 |
| 2008/0292250 A1 | 11/2008 | Hino |
| 2009/0270137 A1 * | 10/2009 | Sorensen et al. .............. 455/572 |
| 2009/0280758 A1 | 11/2009 | Pratt et al. |
| 2009/0298440 A1 * | 12/2009 | Takeya et al. .............. 455/67.14 |
| 2010/0112967 A1 | 5/2010 | Sorensen |
| 2010/0144286 A1 * | 6/2010 | Sorensen ......................... 455/73 |
| 2010/0311474 A1 * | 12/2010 | Donovan et al. .............. 455/574 |
| 2011/0124364 A1 * | 5/2011 | Donovan et al. .............. 455/522 |
| 2012/0071159 A1 * | 3/2012 | Akhi et al. ..................... 455/425 |
| 2012/0256684 A1 * | 10/2012 | Sorrells et al. .................. 330/69 |

FOREIGN PATENT DOCUMENTS

| | | |
|---|---|---|
| EP | 1 986 331 | 10/2008 |
| EP | 2200183 | 6/2010 |
| GB | 2369734 | 6/2002 |
| JP | 2003 163607 | 6/2003 |
| WO | 98/49771 | 11/1998 |
| WO | 01/22604 | 3/2001 |
| WO | 03/075452 | 9/2003 |
| WO | 2004/077664 | 9/2004 |
| WO | 2007/149346 | 12/2007 |

OTHER PUBLICATIONS

Akhi et al., U.S. Appl. No. 12/887,464, filed Sep. 21, 2010.

* cited by examiner

| GAIN STATE | f | VGA SETTING | $V_{bias}$ (MODULATION SCHEME S1) | $V_{bias}$ (MODULATION SCHEME S2) | $V_{bias}$ (MODULATION SCHEME S3) |
|---|---|---|---|---|---|
| H ⋮ ⋮ |  $f_1$ ⋮ ⋮ | PDM=80 ⋮ | 3.45V ⋮ | 3.15 ⋮ | 3.0 ⋮ |
|  | $f_e$ ⋮ ⋮ | 96 ⋮ | 3.3 ⋮ | 3.0 ⋮ | 2.8 ⋮ |
|  | $f_h$ ⋮ ⋮ | 93 ⋮ | 3.5 ⋮ | 3.25 ⋮ | 3.05 ⋮ |
| H | $f_2$ | 90 | 3.4 | 3.05 | 2.9 |
| M ⋮ ⋮ M | | | ⋮ | | |
| L ⋮ ⋮ L | | | ⋮ | | |

FIG. 4

WIRELESS TRANSCEIVER WITH AMPLIFIER BIAS ADJUSTED BASED ON MODULATION SCHEME AND TRANSMIT POWER FEEDBACK

BACKGROUND

This relates generally to wireless communications circuitry, and more particularly, to calibrating wireless communications circuitry to allow reduced power consumption.

Handheld electronic devices and other portable electronic devices are becoming increasingly popular. Examples of handheld devices include handheld computers, cellular telephones, media players, and hybrid devices that include the functionality of multiple devices of this type. Popular portable electronic devices that are somewhat larger than traditional handheld electronic devices include laptop computers and tablet computers.

Due in part to their mobile nature, portable electronic devices are often provided with wireless communications capabilities. For example, handheld electronic devices may use cellular telephone communications standards to communicate with cellular networks.

To reduce power consumption in electronic devices and thereby extend the amount of time that devices can run on battery power, it would be desirable to be able to operate wireless communications circuitry with improved efficiency.

SUMMARY

An electronic device may include wireless communications circuitry having antenna structures for transmitting and receiving radio-frequency signals. The wireless communications circuitry may include a radio-frequency transceiver with a variable gain amplifier that produces radio-frequency signals for transmission. A power amplifier circuit may be used to amplify radio-frequency signals at the output of the variable gain amplifier for transmission through the antenna structures. An adjustable voltage supply may be used to supply an adjustable power amplifier bias voltage to the power amplifier circuit. The magnitude of the power amplifier bias voltage may be adjusted in real time during the operation of the electronic device. The power amplifier circuitry may operate with greater linearity at higher bias voltages, so bias voltage magnitude may be maintained at relatively high levels when more linearity is required and may be maintained at lower levels when less linearity is needed. Lowering the bias voltage for the power amplifier circuitry whenever possible may help to reduce power consumption.

Multiple modulation schemes may be supported by the wireless communications circuitry. Some modulation schemes may require greater power amplifier linearity than others to satisfy desired performance criteria such as maximum allowed levels of adjacent channel leakage. To minimize power consumption, the electronic device may adjust the magnitude of the power amplifier bias voltage based on factors such as the current modulation scheme that is being used. When a modulation scheme is being used that requires that the power amplifier circuit operate with relatively high amounts of linearity, the bias voltage may be larger than when a modulation scheme is being used that requires that the power amplifier circuit operate with lower amounts of linearity. Power amplifier voltage can also be adjusted across operating frequency (channel and band), cellular telephone standard, power amplifier gain state, and other factors.

A power detector may be used to monitor the amount of power that is being transmitted. Gain settings for the variable gain amplifier may be adjusted based on calibration data and based on feedback from the power detector. These adjustments may help ensure that the electronic device transmits signals at appropriate levels across various operating frequencies and may help minimize the amount of calibration data that is stored in the device.

Further features of the invention, its nature and various advantages will be more apparent from the accompanying drawings and the following detailed description.

BRIEF DESCRIPTION OF THE DRAWINGS

FIG. 4 shows an illustrative calibration table containing variable gain amplifier control settings for frequency compensation and containing power amplifier voltage bias settings as a function of factors such as amplifier gain state and operating frequency for multiple cellular telephone standards and multiple corresponding cellular telephone modulation schemes in accordance with an embodiment of the present invention.

DETAILED DESCRIPTION

This relates to wireless communications, and more particularly, to calibrating and operating wireless electronic devices to enhance power consumption efficiency while satisfying performance constraints.

Figure 1:
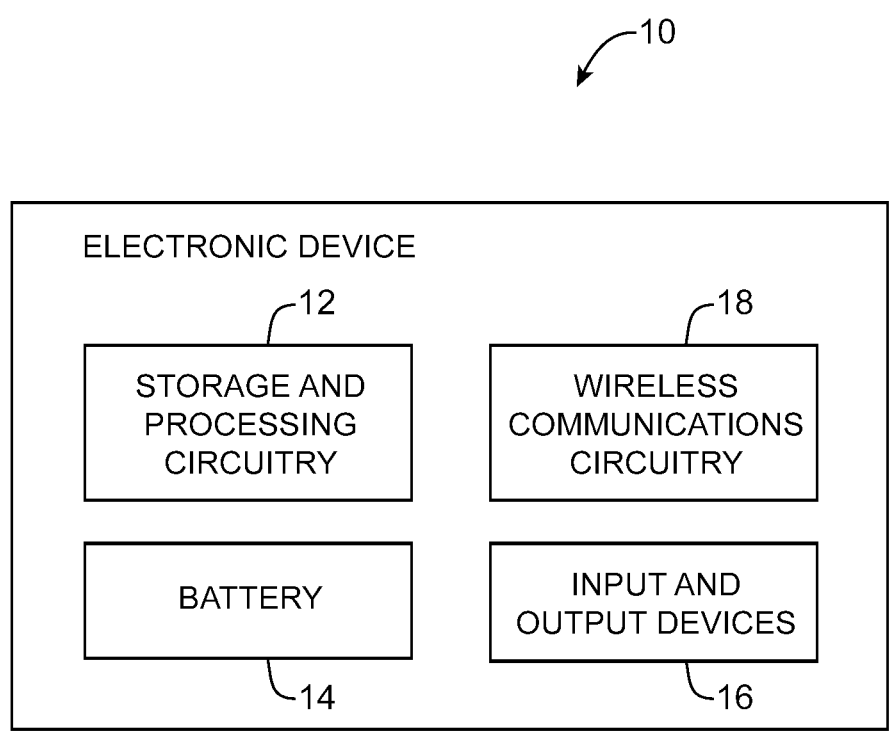
FIG. 1 is a diagram of an illustrative electronic device with wireless communications circuitry suitable for calibration in accordance with an embodiment of the present invention.

An illustrative wireless electronic device is shown in FIG. 1. Wireless electronic device 10 of FIG. 1 may be a cellular telephone, a tablet computer, a laptop computer, a wristwatch or pendent device, other miniature and portable devices, or other electronic equipment.

As shown in FIG. 1, device 10 may include storage and processing circuitry 12. Storage and processing circuitry 12 may include one or more different types of storage such as hard disk drive storage, nonvolatile memory (e.g., flash memory or other electrically-programmable-read-only memory), volatile memory (e.g., static or dynamic random-access-memory), etc. Storage and processing circuitry 12 may be used in controlling the operation of device 10. Processing circuitry in circuitry 12 may be based on processors such as microprocessors, microcontrollers, digital signal processors, dedicated processing circuits, power management circuits, audio and video chips, and other suitable integrated circuits.

Storage and processing circuitry 12 may be used to run software on device 10, such as internet browsing applications, voice-over-internet-protocol (VOIP) telephone call applications, email applications, media playback applications, operating system functions, etc. Storage and processing circuitry 12 may be used in implementing suitable communications protocols. Communications protocols that may be implemented using storage and processing circuitry 12 include internet protocols, wireless local area network protocols (e.g., IEEE 802.11 protocols—sometimes referred to as Wi-Fi®), protocols for other short-range wireless communications links such as the Bluetooth® protocol, protocols for handling cellular telephone communications services, etc.

Device 10 may have one or more batteries such as battery 14. To minimize power consumption and thereby extend the life of battery 14, storage and processing circuitry 12 may be used in implementing power management functions for device 10. For example, storage and processing circuitry 12 may be used to adjust the power supply voltages that are used in powering the radio-frequency power amplifier circuitry. Whenever possible, these power amplifier bias voltages may be reduced to conserve power. Storage and processing circuitry 12 may also be used to adjust the gain state of radio-frequency power amplifier circuitry on device 10 and may be used in adjusting the gain of a variable gain amplifier (VGA) that feeds output signals to the power amplifier circuitry. These adjustments may be made automatically in real time based on calibration data (sometimes referred to as calibration table data), based on feedback from a power detector or other sensors, and using control algorithms (software). For example, code may be stored in storage and processing circuitry 12 that configures storage and processing circuitry 36 to implement a control scheme in which operating settings are adjusted in accordance with calibration data and power detector feedback to satisfy desired performance criteria such as desired transmit powers and adjacent channel leakage values while minimizing power consumption.

Input-output devices 16 may be used to allow data to be supplied to device 10 and to allow data to be provided from device 10 to external devices. Examples of input-output devices 16 that may be used in device 10 include display screens such as touch screens (e.g., liquid crystal displays or organic light-emitting diode displays), buttons, joysticks, click wheels, scrolling wheels, touch pads, key pads, keyboards, microphones, speakers and other devices for creating sound, cameras, sensors, etc. A user can control the operation of device 10 by supplying commands through devices 16. Devices 16 may also be used to convey visual or sonic information to the user of device 10. Devices 16 may include connectors for forming data ports (e.g., for attaching external equipment such as computers, accessories, etc.).

Wireless communications devices 18 may include communications circuitry such as radio-frequency (RF) transceiver circuitry formed from one or more integrated circuits, power amplifier circuitry (e.g., power amplifier circuitry that is controlled by control signals from storage and processing circuitry 12 to minimize power consumption while satisfying desired performance criteria), passive RF components, antennas, and other circuitry for handling RF wireless signals.

Device 10 can communicate with external devices such as accessories, computing equipment, and wireless networks over wired and wireless communications paths.

For example, accessories such as wired or wireless headsets may communicate with device 10. Device 10 may also be connected to audio-video equipment (e.g., wireless speakers, a game controller, or other equipment that receives and plays audio and video content), or a peripheral such as a wireless printer or camera.

Device 10 may use a wired or wireless path to communicate with a personal computer or other computing equipment. The computing equipment may be, for example, a computer that has an associated wireless access point (router) or an internal or external wireless card that establishes a wireless connection with device 10. The computer may be a server (e.g., an Internet server), a local area network computer with or without Internet access, a user's own personal computer, a peer device (e.g., another portable electronic device 10), or any other suitable computing equipment.

Device 10 can also communicate with wireless network equipment such as cellular telephone base stations and associated cellular towers, etc. Such wireless networks may include network management equipment that monitors the wireless signal strength of the wireless handsets such as device 10 that are in communication with the network. To improve the overall performance of the network and to ensure that interference between handsets is minimized, the network management equipment may send power adjustment commands (sometimes referred to as transmit power control commands) to each handset. The transmit power control settings that are provided to the handsets direct handsets with weak signals to increase their transmit powers, so that their signals will be properly received by the network. At the same time, the transmit power control settings may instruct handsets whose signals are being received clearly at high power to reduce their transmit power control settings. This reduces interference between handsets and allows the network to maximize its use of available wireless bandwidth.

When devices such as device 10 receive transmit power control settings from the network or at other suitable times, each device 10 may make suitable transmission power adjustments. For example, a device may adjust the power level of signals transmitted from transceiver circuitry to radio-frequency power amplifiers on the device and may adjust the radio-frequency power amplifiers. Adjustments such as these may include gain mode settings adjustments and power supply voltage adjustments.

The output signals from the power amplifiers in devices 10 are wirelessly transmitted from device 10 to suitable receivers using antennas in devices 10. Power amplifiers in devices 10 may contain one or more gain stages. Each power amplifier may, for example, contain two gain stages, three gain stages, or more than three gain stages. Gain mode adjustments may be made to control how many of the gain stages in a given power amplifier are active. If, for example, a power amplifier contains three gain stages, a gain mode adjustment may control whether a power amplifier is operating in a high gain mode in which all three power amplifier stages that are available are being used, a medium gain mode in which two of the three power amplifier stages are active, or a low gain mode in which only one of the gain stages is active and the other gain stages have been shut down. Gain mode adjustments in which one or more unneeded stages are deactivated in this way may be made to conserve power. Power amplifier supply voltage adjustments may also be used to help minimize power consumption at a given gain setting.

In typical circuit architectures, a transceiver circuit may supply radio-frequency signals to the input of a power amplifier for transmission through an antenna. The transceiver circuit may contain a variable gain amplifier (VGA). The power at which the transceiver circuit outputs radio-frequency signals (i.e., the output of the VGA) establishes an input power level for the power amplifier. Adjustments to the VGA may be made to adjust the power of the power of radio-frequency signals transmitted by device 10. The response of circuitry 18 is typically not inherently flat as a function of frequency, so compensating adjustments may be made to the settings used for the VGA (i.e., to implement frequency compensation).

The antenna structures and wireless communications devices of device 10 may support communications over any suitable wireless communications bands. For example, wireless communications circuitry 18 may be used to cover communications frequency bands such as cellular telephone voice and data bands at 850 MHz, 900 MHz, 1800 MHz, 1900 MHz, 2100 MHz, the Wi-Fi® (IEEE 802.11) bands at 2.4 GHz and 5.0 GHz (also sometimes referred to as wireless local area network or WLAN bands), the Bluetooth® band at 2.4 GHz, the global positioning system (GPS) band at 1575.42 MHz, etc.

Device 10 can cover these communications bands and other suitable communications bands with proper configuration of the antenna structures in wireless communications circuitry 18. Any suitable antenna structures may be used in device 10. For example, device 10 may have one antenna or may have multiple antennas. The antennas in device 10 may each be used to cover a single communications band or each antenna may cover multiple communications bands. If desired, one or more antennas may cover a single band while one or more additional antennas are each used to cover multiple bands.

Figure 2:
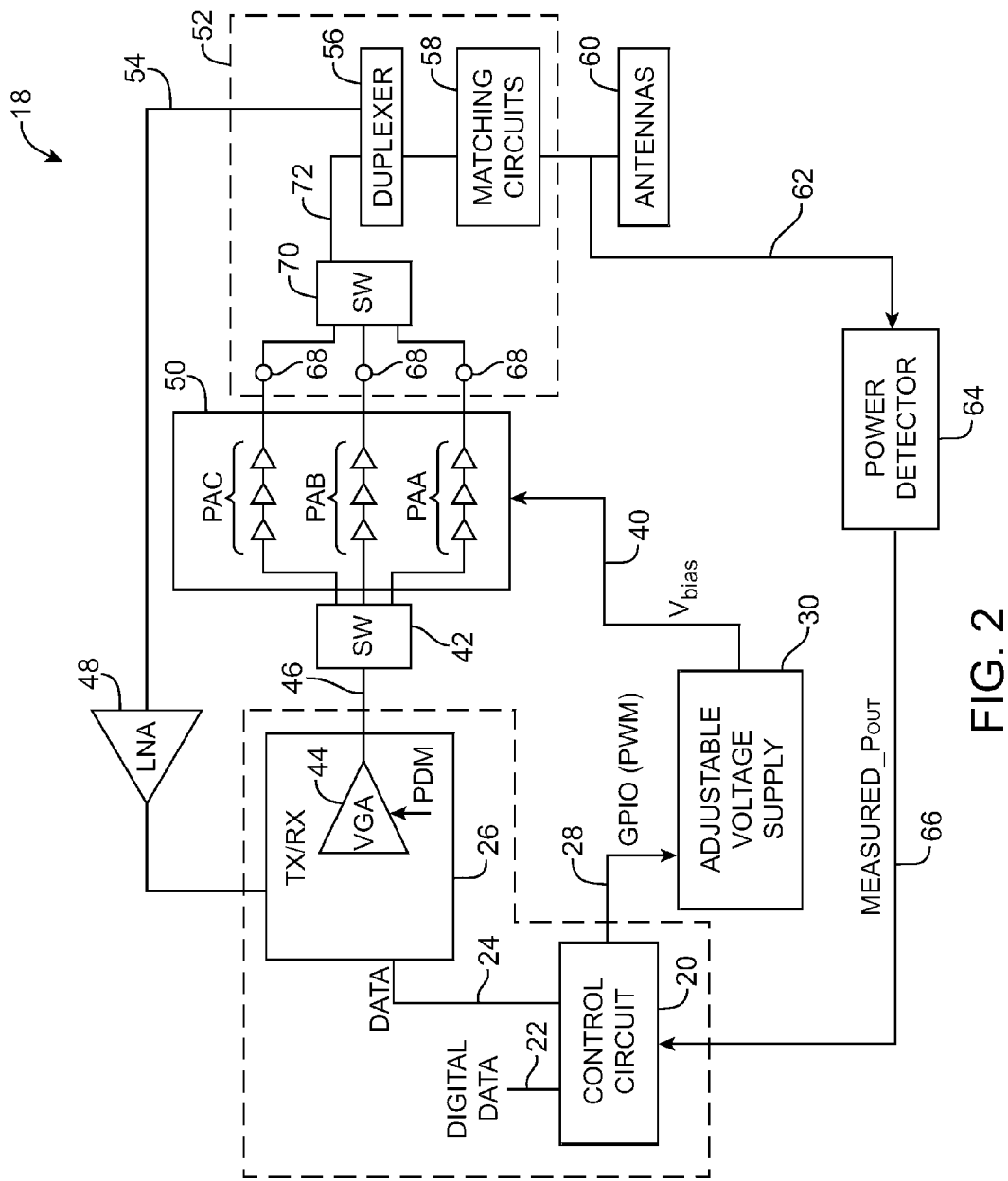
FIG. 2 is a circuit diagram of illustrative wireless communications circuitry that may be used in an electronic device calibrated in accordance with an embodiment of the present invention.

Illustrative wireless communications circuitry that may be used in circuitry 18 of FIG. 1 in device 10 is shown in FIG. 2. As shown in FIG. 2, wireless communications circuitry 18 may include one or more antennas such as antennas 60. Digital data signals that are to be transmitted by device 10 may be provided to circuit 20 using path 22 (e.g., from storage and processing circuitry 12 of FIG. 1).

Circuit 20 may modulate these signals in accordance with a desired cellular telephone standard and modulation scheme and may provide corresponding output signals DATA for transmission to transceiver 26 via path 24. Circuit 20 may be implemented using a single integrated circuit (e.g., a baseband processor integrated circuit) or using multiple circuits. Circuit 20 may include control circuitry (e.g., storage and processing circuitry 12 of FIG. 1).

The control circuitry may be used to issue pulse width modulation (PWM) control signals or other suitable control signals on path 28 that adjust the level of voltage Vbias that is produced by adjustable power supply voltage 30 on line 40. Voltage Vbias may be used as a power supply voltage for active power amplifier stages in power amplifier circuitry 50. Circuitry 20 and 26 serve as wireless communications circuitry that is used in transmitting signals through antenna structures 60 in accordance with various cellular telephone modulation schemes.

Signals that are to be transmitted over antennas 60 may be amplified by transmitter circuitry in transceiver circuitry 26 using variable gain amplifier (VGA) 44. The gain of VGA 44 may be controlled by control signal PDM. The value of this control signal may be adjusted in real time using control circuit 20 or other control circuitry in device 10 (see, e.g., storage and processing circuitry 12 of FIG. 1). The output of VGA 44 may be coupled to power amplifier circuitry 50 via path 46 and switch 42. Power amplifier circuitry 50 (sometimes referred to as a power amplifier circuit or power amplifier) may contain one or more individual power amplifiers such as power amplifiers PAA, PAB, and PAC in the example of FIG. 2. Each power amplifier may be used to handle a different cellular telephone standard or frequency band. The state of switches 42 and 70 can be controlled (e.g., by control circuit 20) to switch an appropriate power amplifier into use.

During data transmission, power amplifier circuitry 50 may boost the output power of transmitted signals to a sufficiently high level to ensure adequate signal transmission. Power-amplifier-specific matching circuits 68 may be interposed between the outputs of power amplifiers 50 and switch 70 for impedance matching.

Radio-frequency (RF) output stage circuitry 52 may contain radio-frequency switches such as switch 70 and passive elements such as duplexers and diplexers (e.g., duplexer 56). Duplexer 56 may be used to route input and output signals based on their frequency. For example, duplexer 56 may route output signals from the output of switch 70 on path 72 to matching circuits 58 and antennas 60 and may route input signals that have been received by antennas 60 and matching circuits 58 to path 54. Matching circuitry 58 may include a network of passive components such as resistors, inductors, and capacitors and ensures that antenna structures 60 are impedance matched to the rest of circuitry 18. Low noise amplifier 48 may amplify received signals on path 54 and may provide these signals to transceiver 26. Transceiver 26 may provide received signals to circuit 20 (e.g., a baseband module) as signals DATA on path 24.

Power detector 64 may be used to provide control circuit 20 with information on the power of transmitted radio-frequency signals. Tapped power Pout may be conveyed to power detector 64 via path 62. A corresponding signal MEASURED POUT that represents the value of Pout as measured by power detector 64 may be conveyed to control circuit 20 via path 66. Feedback from power detector 64 may be used to ensure that the power of transmitted radio-frequency signals is at desired levels. For example, detector 64 may be used to help ensure that the output of wireless communications circuitry 18 is flat across a range of operating frequencies within a communications band.

As device 10 is operated in a cellular network, the amount of power that is transmitted by wireless circuitry 18 is typically adjusted up and down in real time. For example, if a user is in the vicinity of a cellular tower, the cellular tower may issue a command (sometimes referred to as a TPC command) that instructs device 10 to reduce its transmitted power level. If a user travels farther away from the tower, the tower may issue a TPC command that requests an increase in transmitted power.

The gain state of the current power amplifier in use may be adjusted to conserve power while ensuring that required amounts of output power can be satisfactorily produced. For example, when transmitted power requirements are modest, one or more power amplifier gain stages may be deactivated to conserve power.

Figure 3A:
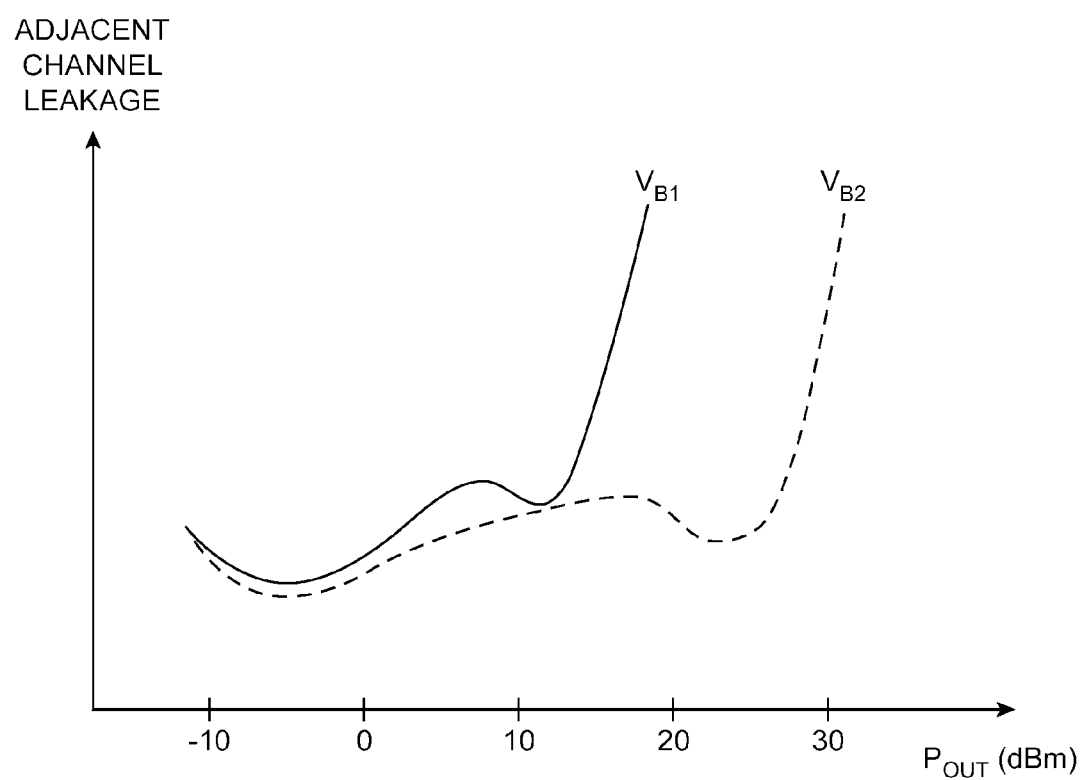
FIG. 3A is a graph showing how adjacent channel leakage performance may be influenced by power amplifier bias voltage in accordance with an embodiment of the present invention.

Power can also be conserved by reducing Vbias in certain circumstances. The magnitude of Vbias affects power amplifier linearity. Nonlinearities can result in signal distortion and adverse effects such as increases in adjacent channel leakage. As shown in FIG. 3A, for example, an amplifier will generally exhibit more adjacent channel leakage (sometimes referred to as adjacent channel leakage ratio or adjacent channel power) at a given output power when operated at low bias Vb1 than when operated at high bias Vb2. Nevertheless, maximum Vbias levels are generally only required when it is desired to maximize power amplifier linearity. When less power amplifier linearity is tolerable, the magnitude of Vbias can be reduced. Because operation with lowered Vbias settings can reduce power consumption, device 10 preferably reduces Vbias from its nominal maximum level whenever possible.

When controlling the operation of wireless circuitry 18 in this way to conserve power, care should be taken that relevant operating criteria are being satisfied. For example, a wireless carrier or other entity may require that a cellular telephone meet certain minimum standards when operating in the network of the wireless carrier. A carrier may, for example, establish required limits on adjacent channel leakage. Devices that allow too much adjacent channel leakage will not be permitted to operate in the carrier's network. Power can be conserved by backing Vbias off from its nominal maximum value, but only so long as this decrease in power amplifier bias does not cause adjacent channel leakage limits or other performance criteria to be violated.

Figure 3B:
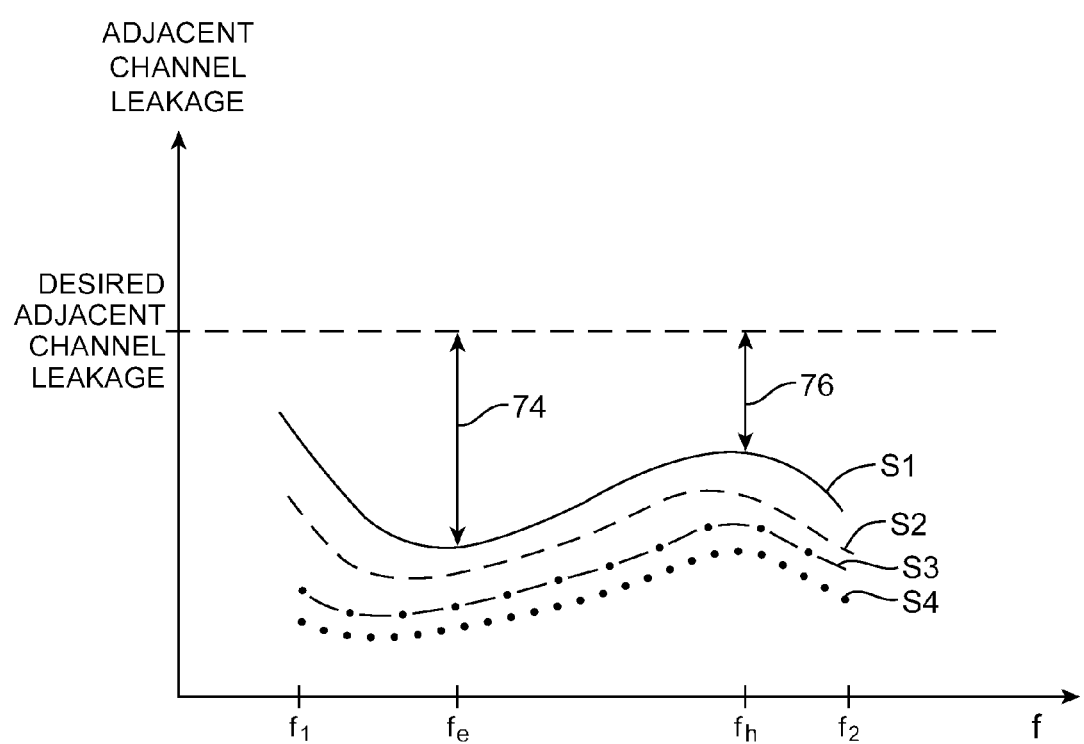
FIG. 3B is a graph showing how adjacent channel leakage characteristics may vary as a function of transmitter frequency and factors such as cellular telephone standard and cellular telephone modulation scheme in electronic devices using wireless communications circuitry in accordance with an embodiment of the present invention.

Due to frequency-dependent performance variations in the components that make up circuitry 18, there are some frequencies in which it is easier to satisfy adjacent channel leakage requirements and other frequencies in which it is harder to satisfy adjacent channel leakage requirements. A typical scenario is illustrated in FIG. 3B. In the graph of FIG. 3B, the adjacent channel leakage characteristics of device 10 have been plotted as a function of frequency for an illustrative communications band covering frequencies from f1 to f2. The flat dashed line in FIG. 3B represents a maximum allowed adjacent channel leakage level. Curves such as curves S1, S2, S3, and S4 correspond to respective data modulation schemes. Each curve shows how much adjacent channel leakage is produced as a function of frequency, assuming that Vbias is held constant. The family of curves shown in FIG. 3B may correspond to the use of a particular power amplifier (e.g., power amplifier PAB of FIG. 2) and corresponding cellular telephone standard. Different sets of adjacent channel leakage curves may be used to represent adjacent channel leakage performance for different cellular telephone standards and different modulation schemes used by device 10. These additional sets of adjacent channel leakage curves have not been plotted in the diagram of FIG. 3B to avoid over-complicating the drawing.

Consider, as an example, curve S1. All of the adjacent channel leakage values of curve S1 exhibit lower values of adjacent channel leakage than the maximum permitted adjacent channel leakage value. This indicates that it will be possible to reduce Vbias at least somewhat from its maximum value. The shape of curve S1 is not flat, which indicates that different amounts of power amplifier bias voltage reduction may be appropriate at different frequencies. In particular, because of the frequency dependence of the adjacent channel leakage performance of circuitry 18, there is more operating margin at some frequencies than others. For example, the amount of margin at frequency fe (margin 74) is greater than the amount of margin at frequency fh (margin 76). Because there is more adjacent channel leakage margin at frequency fe than frequency fh, circuitry 18 can direct voltage supply 30 (FIG. 2) to produce a smaller value of Vbias when circuitry 18 is operating at frequency fe than when circuitry 18 is operating at frequency fh.

Moreover, because each modulation scheme may potentially exhibit a unique adjacent channel leakage performance curve, circuitry 18 can reduce power consumption even further by taking into account which modulation scheme is being used by circuit 20. When a modulation scheme is being used that exhibits more adjacent channel leakage margin, Vbias may be reduced more (and more power can be conserved) than when a modulation scheme is being used that exhibits less adjacent channel leakage margin. Modulation schemes that operate at lower data rates will typically exhibit better adjacent channel leakage margin than modulation schemes with higher data rates (as an example).

In the example of FIG. 3B, modulation scheme S2 exhibits less adjacent channel leakage than modulation scheme S1, modulation scheme S3 exhibits less adjacent channel leakage than modulation scheme S2, and modulation scheme S4 exhibits less adjacent channel leakage than modulation scheme S3. As a result, the greatest Vbias reductions may be achieved when using modulation scheme S4. Progressively lower Vbias reductions can be used when operating using modulation schemes S3, S2, and S1.

In general, circuitry 18 may support operation with any suitable number of cellular telephone standards and each cellular telephone standard may be characterized by any suitable number of different modulation schemes. In the illustrative scenario of FIG. 3B, the cellular telephone standard that is being used supports four different modulation schemes, each of which is characterized by a different one of curves S1, S2, S3, and S4. This is merely illustrative. Each cellular telephone standard may support any suitable number of modulation schemes. Moreover, the shape of the curves of FIG. 3B is merely provided as an example. Actual curves in device 10 will typically be shaped differently, depending on the particular performance characteristics of the power amplifier circuitry and other wireless circuitry being used.

Examples of cellular telephone standards and corresponding modulation schemes that may be supported by wireless circuitry 18 and device 10 include: the Global System for Mobile Communications (GSM) "2G" cellular telephone standard and corresponding Gaussian Minimum Shift Keying (GMSK) and 8 Phase Shift Keying (8PSK) modulation schemes, the Evolution-Data Optimized (EVDO) cellular telephone standard and corresponding Binary Phase Shift Keying (BPSK), Quadrature Phase Shift Keying (QPSK), and 8PSK modulation schemes, the "3G" Universal Mobile Telecommunications System (UMTS) cellular telephone standard and corresponding BPSK, QPSK, 16 Quadrature Amplitude Modulation (16-QAM), and 64-QAM modulation schemes, the "3G" Code Division Multiple Access 2000 (CDMA 2000) cellular telephone standard and corresponding BPSK and QPSK modulation schemes, and the "4G" Long Term Evolution (LTE) cellular telephone standard and corresponding QPSK, 16-QAM, and 64-QAM modulation schemes. Other cellular telephone standards and modulation schemes may be used if desired. These cellular telephone standards and modulation schemes are merely illustrative.

As an example of two operating configurations that might exhibit different amounts of adjacent channel leakage, a first adjacent channel leakage characteristic might be produced when using a cellular telephone standard of "UMTS" and a modulation scheme of "BPSK" (e.g., in UMTS Band 5 at 850 MHz), whereas a second (higher margin) adjacent channel leakage characteristic might be produced when using a cellular telephone standard of "CDMA 2000" and a modulation scheme of "BPSK" (e.g., in CDMA Band Class 0 at 850 MHz).

The linearity requirements of different modulation schemes typically increase with increasing data rate and/or number of phases and amplitudes involved. For example, when using the EVDO cellular telephone standard, 8PSK may have a greater linearity requirement (and therefore require a larger voltage bias for its power amplifier) than QPSK, which may, in turn, have a greater linearity requirement than BPSK. Similarly, 8PSK may have a greater linearity requirement than GMSK for GSM communications. In UMTS systems, the modulation schemes BPSK, QPSK, 16-QAM, and 64-QAM may have successively increasing linearity requirements. In CDMA 2000 systems, the QPSK modulation scheme may have greater linearity requirements than the BPSK modulation scheme. In LTE systems, the 64-QAM modulation scheme may have greater linearity requirements than the 16-QAM modulation scheme, which may, in turn, have greater linearity requirements than the QPSK modulation scheme.

To ensure that the power output of circuitry 18 is flat across all desired operating frequencies (e.g., to implement frequency compensation from f1 to f2 in the FIG. 3B example), the control setting (e.g., PDM) for variable gain amplifier (VGA) 44 and therefore the gain produced by VGA 44 as a function of frequency may be adjusted. Frequency compensation settings (e.g., variable gain amplifier settings as a function of operating frequency f) and the Vbias settings that device 10 is to use under various operating conditions form calibration data that can be used when operating device 10. The calibration data can be stored as entries in one or more tables. The calibration data may be stored in device 10 and used to determine how to adjust VGA 44 and power supply 30 during operation of device 10.

Illustrative calibration data 78 is shown in FIG. 4. As shown in FIG. 4, calibration data 78 may include columns of Vbias settings data such as columns 80, 80' and 80". Data 78 may also contain a column of VGA settings data such as column 82. Data 78 may cover multiple amplifier gain states (e.g., "H," "M," and "L") and a range of operating frequencies f. The data in table 78 may be used in determining how to operate device 10 so as to minimize power consumption while meeting adjacent channel leakage requirements or other operating criteria.

The Vbias settings in column 80 and the VGA settings in column 82 may correspond to operation of device 10 using a particular modulation scheme such as a worst-case modulation scheme (i.e., the modulation scheme for a particular communications band that results in the least adjacent channel leakage margin). For example, the Vbias data of column 80 may correspond to use of a modulation scheme such as modulation scheme S1 in the example of FIG. 3B. The VGA settings data in column 82 may instruct device 10 how to control variable gain amplifier 44 when operating using the same worst-case modulation scheme (i.e., scheme S1).

Vbias data in the other columns of table 78 may correspond to operations with other modulation schemes. For example, the Vbias data in column 80' may correspond to the settings to be used when operating device 10 using modulation scheme S2, the Vbias data in column 80" may correspond to the settings to be used when operating device 10 using modulation scheme S3, etc. Although not shown in FIG. 4, Vbias data for other modulation schemes such as scheme S4 may also be included in table 78, if desired.

When device 10 is operated using the worst-case modulation scheme (scheme S1 in the present example), the information in column 80 may be used to select an appropriate bias voltage Vbias to use in powering power amplifier 50. The settings data in column 82 may be used to determine how to adjust variable gain amplifier 44. Because the VGA settings of column 82 correspond to operate of device 10 with the S1 modulation scheme, the output of circuitry 18 will be fairly flat as a function of frequency. Feedback from power detector 64 (i.e., information on transmitted power that power detector 64 gathered using path 62 and that is provided to control circuit 20 as signal MEASURED_POUT on path 66), may be used to ensure that the transmitted power from circuitry 18 is accurately maintained at a desired power level (e.g., by informing control circuit 20 in real time of any necessary increases or decreases to be made to the gain of variable gain amplifier 44).

When device 10 is operated at other modulation schemes, the appropriate Vbias data to use for that scheme may be obtained from a corresponding one of the other Vbias columns of table 78. For example, when device 10 is operated using the S2 modulation scheme (in this example), device 10 can use the Vbias settings data from column 80' in determining how to bias power amplifier 50. The Vbias settings of column 80" may be used by device 10 when operating device 10 using the modulation scheme corresponding to column 80" (i.e., scheme S3), etc.

When operating device 10 using modulation schemes other than worst-case modulation scheme S1, device 10 can use the variable gain amplifier settings from column 82. These VGA settings may be tailored to use of modulation scheme S1 and may therefore be suboptimal for other schemes. Nevertheless, the VGA settings of columns 82 may be sufficiently close to optimal settings to use as starting points for setting the gain of variable gain amplifier 44 (FIG. 2). By using real time feedback from power detector 64, control circuitry 20 can rapidly adjust the variable gain amplifier setting for amplifier 44 to a more appropriate value for the actual modulation scheme that is currently in use. By including VGA settings data for only a subset of the modulation schemes used by device 10 (i.e., a representative one of the modulation schemes such as the worst-case modulation scheme S1 in this example), the amount of storage that is used to retain table 78 in device 10 may be minimized. The amount of time that is involved in performing calibration operations to produce table 78 may also be reduced.

Data 78 may be stored in one large table or may be stored in multiple tables. Regardless of the data structure format that is used for storing calibration data 78, calibration data 78 is sometimes referred to as calibration table data, Vbias calibration table data, VGA settings table data, etc. and the data structures in which data 78 may be stored are referred to as the calibration table(s), Vbias calibration table, VGA settings table, etc. For each operating frequency and gain state, there is preferably a Vbias entry for each different modulation scheme and at least one VGA settings entry (e.g., the VGA setting for the worst-case modulation scheme).

Calibration data 78 may be obtained during calibration operations in which circuitry 18 is evaluated and corresponding performance data is gathered and processed. Circuitry 18 may be implemented on an evaluation board and/or in test versions of device 10 (sometimes referred to as devices under test). Calibration data may be gathered exhaustively (e.g., for each possible operating frequency f, etc.) or may be gathered using a reduced set of test parameters (e.g., a subset of frequencies f) to reduce test time. When a reduced set of measurements are gathered, data filling techniques such as interpolation techniques may be used to extrapolate calibration results to all desired operating parameter values. The use of sensor circuits such as power detector 64 may help lessen the requirements for calibration data 78 (e.g., by reducing or eliminating the need to include variable gain amplifier settings data in table 78 for every possible modulation scheme). The amount of storage required for storing calibration data 78 in storage in device 10 may also be minimized by implementing the Vbias data in table 78 for only a representative modulation scheme such as the modulation scheme that exhibits the worst case adjacent channel leakage (e.g., scheme S1) and by using a voltage bias offset in determining how to bias power amplifier 50 for other modulation schemes. For example, device 10 may use a 0.3 volt offset (i.e., Vbias may be reduced by 0.3 volts at each frequency relative to the Vbias entry in column 80) when using scheme S2 and may use a 0.5 volt offset (i.e., Vbias may be reduced by 0.5 volts at each frequency relative to the Vbias entry in column 80) when using scheme S3. Other arrangements (e.g., with more Vbias or less Vbias information in table 78 and with more VGA settings data or less VGA settings data in table 78) may be used if desired.

Figure 5:
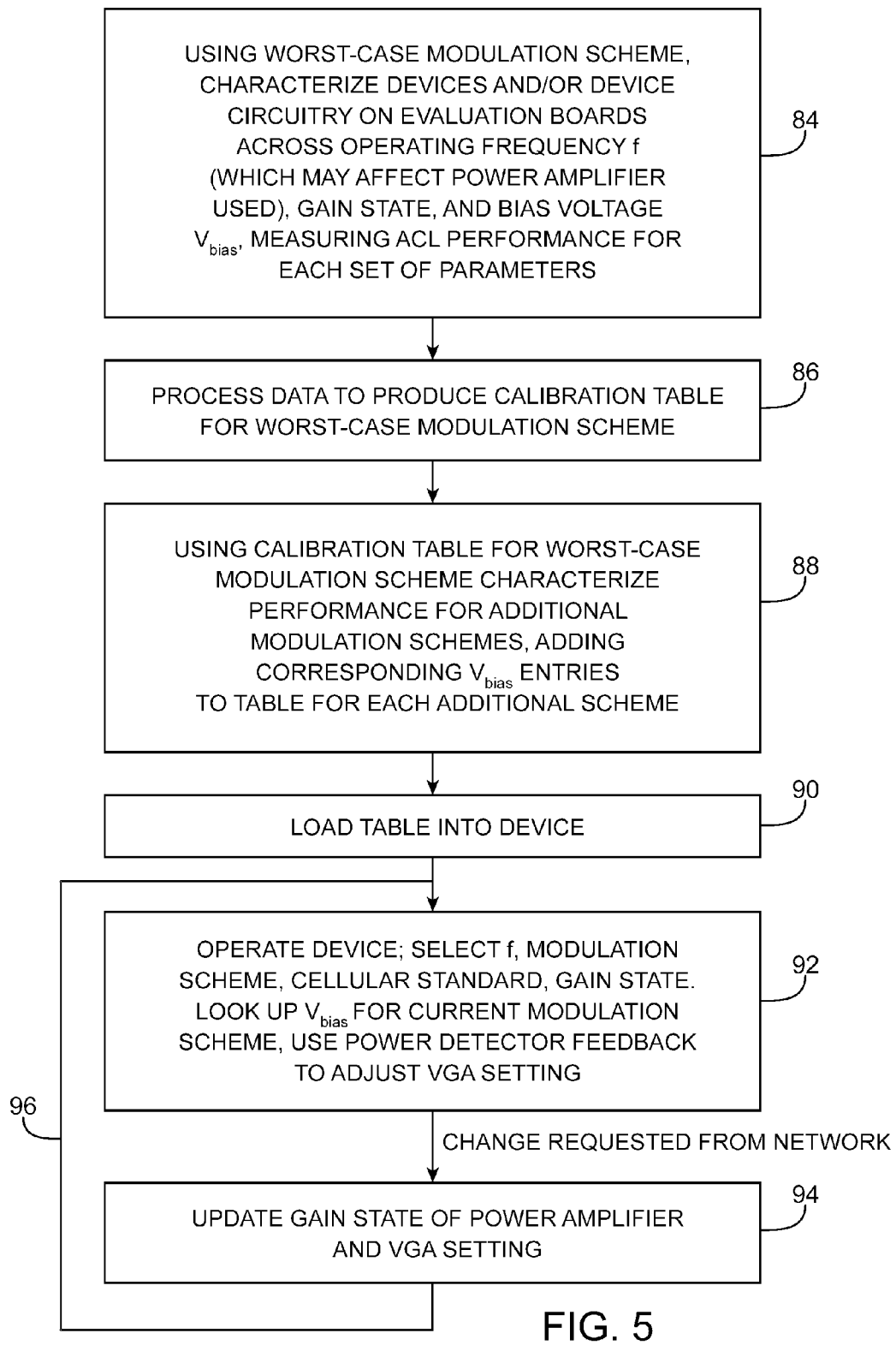
FIG. 5 is a flow chart of illustrative steps involved in calibrating and using wireless electronic devices in accordance with an embodiment of the present invention.

Illustrative steps involved in characterizing wireless communications circuitry 18 and using devices that have been calibrated accordingly are shown in FIG. 5.

Performance measurements that characterize circuitry 18 may be made during the operations of steps 84 and 88. At step 84, performance measurements may be made on wireless circuitry 18 when operating under the worst-case modulation scheme (e.g., modulation scheme S1 in the present example).

Wireless circuitry 18 may be implemented on an evaluation board or may be part of a version of device 10 that is being used to perform characterization measurements. Measurements may be made using one or more devices. For example, performance measurements may be collected using a set of about one to ten devices. Measurements may be made on one or more evaluation boards, samples from a manufacturing line, devices selected from a batch of preproduction devices, or other suitable devices containing wireless circuitry 18.

In testing wireless circuitry 18, external equipment (e.g., a call box, power meter equipment, or other equipment) may be used to transmit and receive wireless signals and may be used to gather test results. Test equipment may be connected to wireless circuitry 18 to control the operation of wireless circuitry 18 during testing and/or test software may run on each device in which wireless circuitry 18 is contained to control the operation of wireless circuitry 18 during testing.

Some or all of the operating frequencies within the communications bands may be evaluated during testing. For example, if a cellular telephone standard involves use of a communications band that extends from frequency f1 to frequency f2, all of the channels between frequency f1 and f2 may be tested or a representative subset of channels may be tested.

During testing, the gain state of the power amplifier may be adjusted. For example, characterizing measurements may be made when the gain state of the power amplifier has been set to a "high" mode in which three power amplifier gain stages are active, a "medium" mode in which two power amplifier gain stages are active, and a "low" mode in which one power amplifier gain stage is active. Vbias may also be adjusted to evaluate the performance of the power amplifier circuitry as a function of bias voltage. At higher bias voltages, the power amplifier circuitry will generally exhibit good linearity. At lower bias voltages, the power amplifier will not behave as linearly as at higher bias voltages, but power consumption will generally be reduced.

Any suitable performance characterizing data may be measured during performance testing. For example, data for computing performance metrics such as bit error rate, frame error rate, signal strength, signal-to-noise ratio, and other metrics may be gathered. With one suitable arrangement, adjacent channel leakage measurements may be made.

As described in connection with curves S1, S2, S3, and S4 in FIG. 3B, the modulation schemes for each cellular telephone standard will generally be characterized by different amounts of performance margin. For each tested set of operating parameters (e.g., for each tested frequency, gain mode, and modulation scheme), adjacent channel leakage may be measured.

During the operations of step 84, performance data may be gathered for the worst-case modulation scheme (e.g., for modulation scheme S1 in the present example).

At step 86, the characterization data that has been gathered on the performance of wireless circuitry 18 using the worst-case modulation scheme may be processed to determine the minimum acceptable Vbias value for each frequency and gain mode for the worst-case modulation scheme. In particular, the Vbias entries for the worst-case scheme (e.g., column 80 of FIG. 4 for scheme S1) may be produced. Variable gain settings data (see, e.g., column 82 of table 78 in the FIG. 4 example) may also be produced (e.g., only for the worst-case modulation scheme S1 to conserve memory).

At step 88, the Vbias table entries (e.g., column 82) from the operations of step 86 may be used in calibrating other modulation schemes. In particular, the calibration settings that were produced during the operations of step 86 may be used to operate wireless circuitry 18 while test signals are transmitted and received using modulation schemes other than the worst-case modulation scheme. For example, the worst-case calibration data of FIG. 4 may be used when communicating using non-worst-case modulation schemes such as the S2 modulation scheme of FIG. 3B, the S3 modulation scheme of FIG. 3B, etc. The performance data that is gathered for the non-worst-case modulation schemes may be processed to identify the minimum Vbias entries that can be used for the non-worst-case modulation schemes while satisfying adjacent channel leakage requirements or other performance requirements (e.g., to produce the data of column 80' for modulation scheme S2, the data of column 80" for modulation scheme S3, etc.).

Once the calibration data of table 78 of FIG. 4 has been produced, this calibration data may be loaded into production devices (step 90). Loading may be performed during device manufacturing, as part of a software (e.g., firmware) update process, or using other suitable loading schemes. Loaded calibration data may be stored in storage in device 10.

At step 92, a device that has been calibrated in this way may be operated in a cellular network. During operation, wireless communications circuitry 18 in device 10 may transmit and receive radio-frequency signals using a particular cellular telephone standard and modulation scheme. The modulation scheme that is used may be determined by link conditions. For example, higher data rate modulation schemes may be available for use only when link quality is high. In response to commands from a cellular tower, device 10 (wireless circuitry 18) may adjust the output power of transmitted radio-frequency signals. Wireless circuitry 18 may adjust variable gain amplifier 44 using the appropriate calibrated control signal for the worst-case modulation scheme (e.g., the entries of column 82 of table 78 in FIG. 4), may select a power amplifier to use based on which cellular telephone standard and band is in use, may adjust the gain state of the selected power amplifier to produce a desired amount of power amplifier gain, and may power the power amplifier circuitry with a Vbias value from the Vbias calibration table column corresponding to the modulation scheme that is being used. Real time feedback from power detector 64 may be used to adjust the setting of variable gain amplifier 44 as needed to ensure that the output power from circuitry 18 has an appropriate level.

When a new command is received from the network that directs device 10 to adjust its settings, device 10 can respond accordingly (step 94). For example, wireless circuitry 18 may update the gain state of the power amplifier to increase or decrease power amplifier gain and therefore produce transmitted radio-frequency signals of a new desired output power level, may change operating frequency, modulation scheme, or other operating parameters, may adjust VGA gain settings to adjust output power, etc. As indicated by line 96, after these settings have been adjusted at step 94, device 10 may continue operating with the newly updated settings at step 92.

The foregoing is merely illustrative of the principles of this invention and various modifications can be made by those skilled in the art without departing from the scope and spirit of the invention.

What is claimed is:

1. An electronic device that is configured to wirelessly transmit radio-frequency signals using a plurality of cellular telephone modulation schemes, comprising:
   antenna structures;
   a transceiver that produces the radio-frequency signals for transmission;
   power amplifier circuitry that amplifies the radio-frequency signals for transmission of the radio-frequency signals through the antenna structures at an output power;
   a power detector that produces measurements of the output power;
   an adjustable voltage supply that supplies an adjustable power amplifier bias voltage to the power amplifier circuitry to power the power amplifier circuitry; and
   control circuitry that is configured to direct the adjustable voltage supply to supply the adjustable power amplifier bias voltage at a level that is adjusted in real time based at least partly on which cellular telephone modulation scheme of the plurality of cellular telephone modulation schemes is currently being used in transmitting the radio-frequency signals through the antenna structures, wherein the control circuitry includes storage that contains calibration data, wherein the calibration data includes calibration data specifying a first power amplifier bias voltage for a first operating frequency and a second power amplifier bias voltage for a second operating frequency, and wherein the first operating frequency is different from the second operating frequency.

2. The electronic device defined in claim 1 wherein the control circuitry is configured to use the measurements of the output power in adjusting the transceiver.

3. The electronic device defined in claim 2 wherein the transceiver includes a variable gain amplifier and wherein the control circuitry is configured to adjust the variable gain amplifier at least partly in response to the measurements of the output power.

4. The electronic device defined in claim 3 wherein the transceiver is configured to transmit the radio-frequency signals using a plurality of modulation schemes selected from the group consisting of: Gaussian Minimum Shift Keying, 8 Phase Shift Keying, Binary Phase Shift Keying, Quadrature Phase Shift Keying, 16 Quadrature Amplitude Modulation, 64-Quadrature Amplitude Modulation.

5. The electronic device defined in claim 4 wherein the transceiver is configured to transmit the radio-frequency signals in accordance with a plurality of cellular telephone standards selected from the group consisting of: a Global System for Mobile Communications cellular telephone standard, an Evolution-Data Optimized cellular telephone standard, a Universal Mobile Telecommunications System cellular telephone standard, a Code Division Multiple Access 2000 cellular telephone standard, and a Long Term Evolution cellular telephone standard.

6. The electronic device defined in claim 1 wherein the calibration data includes calibration data specifying which levels of power amplifier bias voltage the adjustable voltage supply is to supply in multiple power amplifier gain states for the power amplifier circuitry.

7. A method for operating an electronic device with wireless communications circuitry that has a variable gain amplifier that supplies radio-frequency signals, a power amplifier that amplifies the radio-frequency signals and transmits the radio-frequency signals with an output power, an adjustable voltage supply that supplies a bias voltage to the power amplifier, and a power detector that measures the output power, comprising:
   wirelessly transmitting the radio-frequency signals with the wireless communications circuitry using a modulation scheme selected from a plurality of modulation schemes supported by the electronic device; and
   while wirelessly transmitting the radio-frequency signals using the modulation scheme, using the adjustable voltage supply to adjust the bias voltage to a level that is selected based at least partly on which of the plurality of modulation schemes is being used to wirelessly transmit the radio-frequency signals and using measurements from the power detector in adjusting the variable gain amplifier, wherein using the measurements comprises using the measurements to adjust a variable gain amplifier gain setting in a calibration table that corresponds to a modulation scheme with worst-case adjacent channel leakage.

8. The method defined in claim 7 wherein the modulation scheme that is being used to wirelessly transmit the radio-frequency signals comprises a given modulation scheme selected from the group consisting of: Gaussian Minimum Shift Keying, 8 Phase Shift Keying, Binary Phase Shift Keying, Quadrature Phase Shift Keying, 16 Quadrature Amplitude Modulation, 64-Quadrature Amplitude Modulation and wherein wirelessly transmitting comprises wirelessly transmitting using the given modulation scheme.

9. The method defined in claim 7 wherein wirelessly transmitting comprises wirelessly transmitting using a cellular telephone standard selected from the group consisting of: a Global System for Mobile Communications cellular telephone standard, an Evolution-Data Optimized cellular telephone standard, a Universal Mobile Telecommunications System cellular telephone standard, a Code Division Multiple Access 2000 cellular telephone standard, and a Long Term Evolution cellular telephone standard.

10. The method defined in claim 7 wherein using the adjustable voltage supply comprises using the adjustable voltage supply to produce a bias voltage at a level selected based at least partly on a bias voltage entry in the calibration table stored in the electronic device.

11. The method defined in claim 7 wherein using the adjustable voltage supply comprises using the adjustable voltage supply to produce a bias voltage at a level selected based at least partly on a bias voltage entry in the calibration table stored in the electronic device, wherein the plurality of modulation schemes includes a worst-case modulation scheme and a plurality of other modulation schemes, and wherein the calibration table includes minimum bias voltage entries corresponding to the worst-case modulation scheme and minimum bias voltage entries corresponding to each of the other modulation schemes.

12. The method defined in claim 7 further comprising:
   during first wireless operations with the electronic device, wirelessly transmitting radio-frequency signals at a given frequency using a first modulation scheme and during second wireless operations with the electronic device, wirelessly transmitting radio-frequency signals at the given frequency using a second modulation scheme, wherein the second modulation scheme has greater power amplifier linearity requirements than the first modulation scheme at the given frequency, and wherein during use of the second modulation scheme the adjustable voltage supply supplies the bias voltage at a level that is higher than during use of the first modulation scheme.

13. A method of operating an electronic device containing wireless communications circuitry that has been characterized across a plurality of cellular telephone standards and corresponding modulation schemes to produce calibration data for the electronic device, wherein the wireless communications circuitry includes a transceiver that produces radio-frequency signals, a power amplifier that transmits the radio-frequency signals at an output power, and a power detector that obtains measurements of the output power and wherein the calibration data comprises power amplifier bias voltage levels to use for each of the modulation schemes to enhance power conservation during operation of the electronic device, and wherein the transceiver includes a variable gain amplifier, the method comprising:
- wirelessly transmitting the radio-frequency signals using the power amplifier in the electronic device;
- while wirelessly transmitting the radio-frequency signals, applying power amplifier bias voltages to the power amplifier in the electronic device at levels that are adjusted in real time based on the calibration data;
- adjusting the transceiver based at least partly on the measurements of the output power; and
- identifying settings for the variable gain amplifier at a plurality of cellular telephone operating frequencies and a given one of the modulation schemes when producing the calibration data.

14. The method defined in claim 13 further comprising characterizing the wireless communications circuitry at a plurality of power amplifier gain states for the power amplifier when producing the calibration data.

15. The method defined in claim 14 further comprising characterizing the wireless communications circuitry at a plurality of cellular telephone operating frequencies when producing the calibration data.

16. The method defined in claim 13 further comprising producing at least some of the calibration data for a plurality of modulation schemes selected from the group consisting of: Gaussian Minimum Shift Keying, 8 Phase Shift Keying, Binary Phase Shift Keying, Quadrature Phase Shift Keying, 16 Quadrature Amplitude Modulation, 64-Quadrature Amplitude Modulation.

17. The method defined in claim 16 further comprising producing at least some of the calibration data for a plurality of cellular telephone standards selected from the group consisting of: a Global System for Mobile Communications cellular telephone standard, an Evolution-Data Optimized cellular telephone standard, a Universal Mobile Telecommunications System cellular telephone standard, a Code Division Multiple Access 2000 cellular telephone standard, and a Long Term Evolution cellular telephone standard.

* * * * *